United States Patent [19]
Lin et al.

[11] Patent Number: 5,794,836
[45] Date of Patent: Aug. 18, 1998

[54] INERT GAS AIR HORN DISTRIBUTION DEVICE

[75] Inventors: Jeff J. Lin; Peter J. Sinkunas, both of Canton; Myron Lemecha, Dearborn, all of Mich.; Stephen H. P. Wong, Markham, Canada

[73] Assignee: Ford Motor Company, Dearborn, Mich.

[21] Appl. No.: 783,720

[22] Filed: Jan. 16, 1997

[51] Int. Cl.⁶ .................................................. B23K 3/08
[52] U.S. Cl. ........................... 228/33; 228/42; 118/326
[58] Field of Search ........................ 228/33, 42; 118/326

[56] References Cited

U.S. PATENT DOCUMENTS

| | | | |
|---|---|---|---|
| 2,052,869 | 9/1936 | Coanda | 299/107 |
| 2,227,465 | 1/1941 | Roche, Jr. et al. | 118/326 |
| 3,932,151 | 1/1976 | Lav | 118/326 |
| 4,821,948 | 4/1989 | Fisher et al. | 228/223 |
| 4,871,105 | 10/1989 | Fisher et al. | 228/33 |
| 4,894,073 | 1/1990 | Andreae | 118/326 |
| 5,024,856 | 6/1991 | Hohnerlein | 427/37 |
| 5,368,219 | 11/1994 | Hogan et al. | 228/33 |
| 5,402,938 | 4/1995 | Sweeney | 239/431 |
| 5,534,067 | 7/1996 | Fulker et al. | 118/681 |

FOREIGN PATENT DOCUMENTS 4-238667  8/1992  Japan ........................ 228/33

*Primary Examiner*—P. Austin Bradley
*Assistant Examiner*—Jeffrey T. Knapp
*Attorney, Agent, or Firm*—Roger L. May; Joseph W. Malleck

[57] ABSTRACT

An inert gas air horn distribution device employs a labyrinth with a baffle to clean the nitrogen gas used to deposit flux on circuit boards before wave soldering operations. The baffle diverts the gas flow causing heavier flux particles to collect in the labyrinth while the lighter gas exits for use in depositing flux on the circuit boards. The labyrinth cleans the gas thereby keeping the knife clean which produces more uniform results with less maintenance.

10 Claims, 2 Drawing Sheets

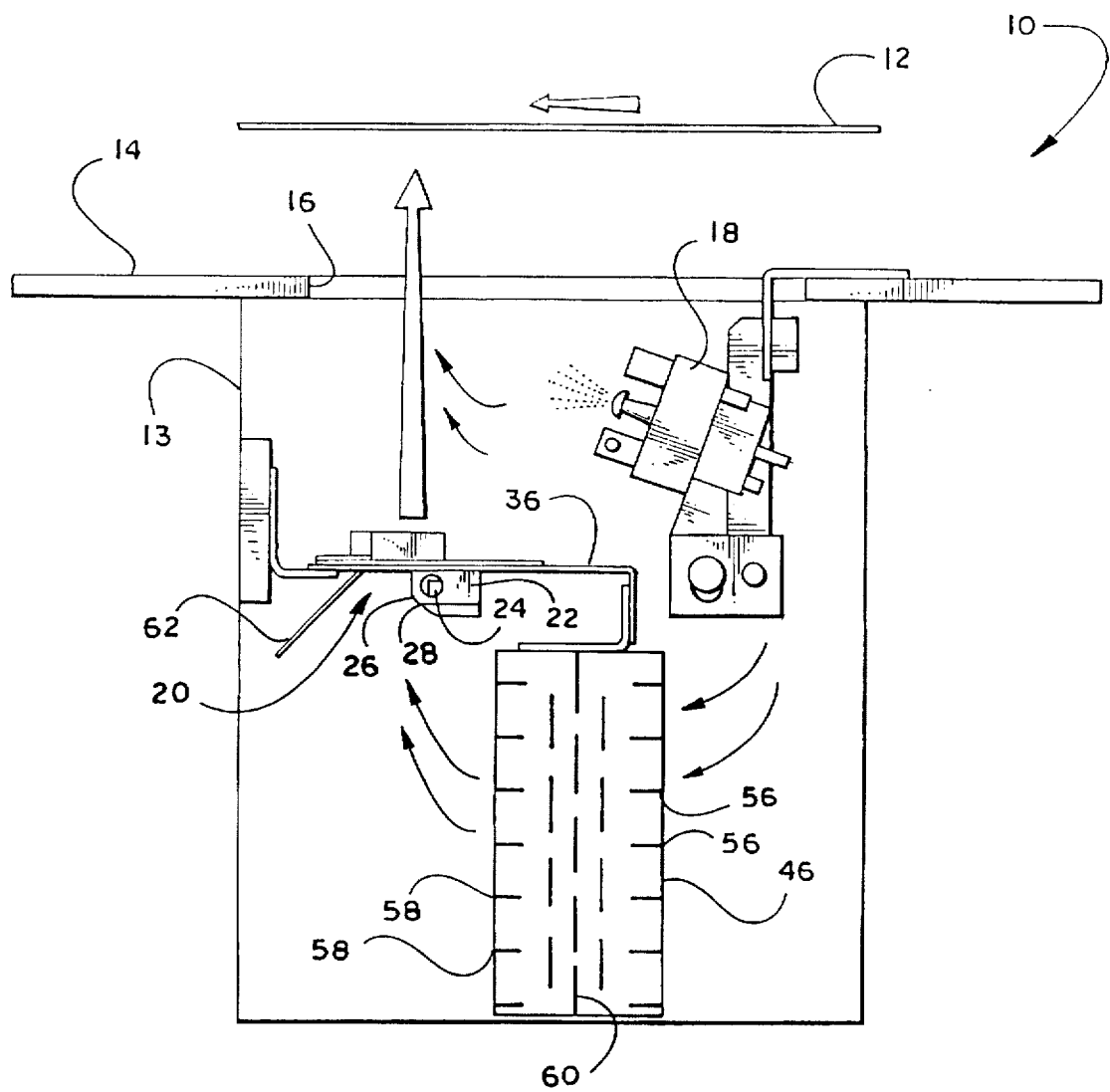
Fig_1

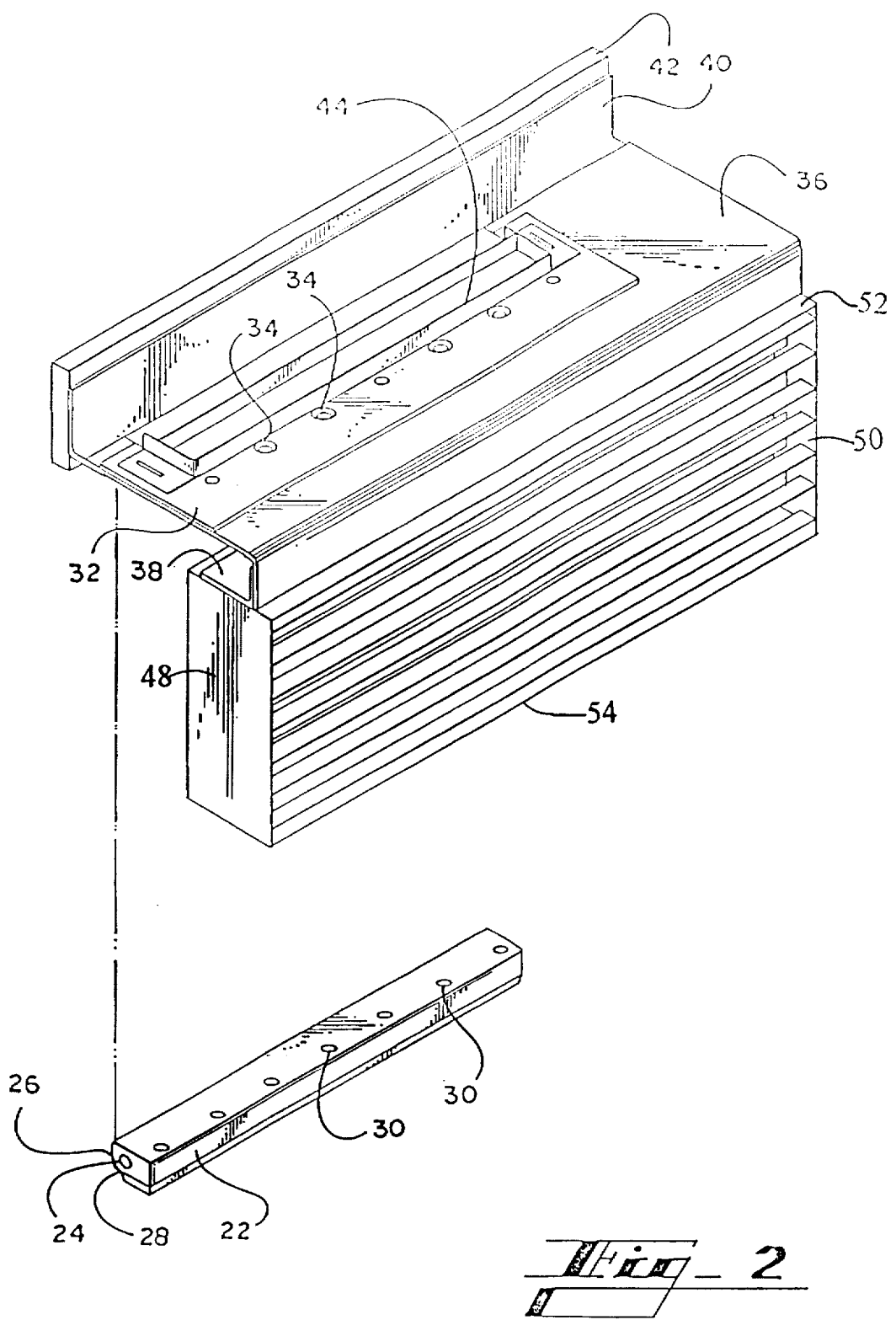
FIG_2

INERT GAS AIR HORN DISTRIBUTION DEVICE

FIELD OF THE INVENTION

The present invention pertains generally to have solder machines for soldering wired circuit boards, and, more particularly to a device for applying flux to the circuit board prior to soldering.

BACKGROUND OF THE INVENTION

In a wave soldering operation flux is atomized and transferred by air flow to a circuit board. Atomizing flux and transferring it by air flow to the circuit board is not an efficient process. Over spray or under spray of the flux in relation to the circuit board causes equipment malfunction and/or material waste in liquid flux and cryogenic nitrogen used to transport the flux to the circuit board. Flux accumulation on the nitrogen knife used to shape and direct transport nitrogen flow distorts the atomized flux distribution on the circuit board and directly affects the solder quality of the end product. Excessive nitrogen consumption to propel the flux to the circuit board contributes to clogging of the spray nozzle which decreases the efficiency of the nitrogen knife requiring more nitrogen to transfer the flux. As a result of flux accumulation, many hours are spent cleaning flux systems, and excessive nitrogen consumption increases the cost of the fluxing process. Accordingly, it will be appreciated that it would be highly desirable to have a wave solder spray fluxing system that is efficient and requires minimal maintenance.

SUMMARY OF THE INVENTION

The present invention is directed to overcoming one or more of the problems set forth above. Briefly summarized, according to one aspect of the present invention, an inert gas air horn distribution device comprises a housing having a cover with an opening; a flux nozzle mounted in the housing for emitting flux toward the opening in the housing cover; a knife assembly having an inlet for receiving compressed gas, a face with a coanda profile, and an outlet for directing the compressed gas in a main stream over the face adhering to the coanda profile and upward toward the housing cover opening entraining surrounding gas in the housing causing the surrounding gas to flow in an entrained stream; and a labyrinth mounted in the housing in the entrained stream to capture flux in the stream and prevent the flux from fouling the knife.

The labyrinth contains a baffle that diverts the entrained stream causing any flux to collect in the labyrinth while allowing gas to exit to join the main stream. The labyrinth cleans the gas of flux so that the knife in not fouled. A clean knife promotes a uniform gas stream for applying the flux evenly on the circuit boards.

These and other aspects, objects, features and advantages of the present invention will be more clearly understood and appreciated from a review of the following detailed description of the preferred embodiments and appended claims, and by reference to the accompanying drawings.

BRIEF DESCRIPTION OF THE DRAWINGS

FIG. 1 is a diagrammatic view of a preferred embodiment of an inert gas air horn distribution device for applying flux to circuit boards incorporating a labyrinth according to the present invention.

FIG. 2 is an exploded perspective view of the labyrinth of FIG. 1.

DETAILED DESCRIPTION OF THE PREFERRED EMBODIMENTS

Referring to FIGS. 1 and 2, an inert gas air horn distribution device 10 is used to deposit soldering flux onto the bottom of a wired circuit board 12 as the circuit board 12 moves relative to the distribution device 10. The device includes a housing 13 forming a tank with a cover 14 that has an opening 16 through which flux flows on its way to the circuit board 12. As the circuit board 12 moves relative to the device 10, the circuit board passes over the opening 16 to receive flux exiting the housing 13. Flux is emitted from a flux nozzle 18 mounted in the housing 13 at a location for directing the flux toward the housing opening 16. The nozzle 18 may be suitably mounted directly to the cover 14 or sidewall of the housing 13, or may be attached to a bracket mounted on the cover or sidewall. The flux nozzle is preferably mounted at a high elevation in the housing near the cover so that flux may be entrained in the gas stream exiting the housing through the cover opening. The flux spray is intercepted by the gas stream and shaped into a thin line of flux for the circuit board. A suitable flux nozzle is one manufactured by Sonotek, Poughkeepsie, N. Y.

A knife assembly 20 is also mounted in the housing 13 at a lower elevation than the flux nozzle 18 so that gas leaving knife assembly 20 directed toward opening 16 in cover 14 intercepts and directs flux emitted from nozzle 18 for deposit onto circuit board 12. The knife assembly 20 includes a knife 22 that has an inlet 24, a face 26 and an outlet 28. Inlet 24 receives compressed gas, preferably nitrogen, from a source outside the housing. The compressed gas flows through the inlet 24 into a plenum chamber in the knife. It is then throttled through a thin nozzle outlet 28 that extends the length of the air knife.

The primary stream of gas exiting the thin nozzle outlet 28 adheres to the face 26 which has a coanda profile. The coanda profile turns the gas 90° and directs the flow up the face of the knife toward the opening 16 in the housing cover 14. The primary gas stream exiting outlet 28 traveling along face 26 immediately begins to entrain surrounding gas without a reduction in velocity because it travels along the face 26 taking advantage of a wall effect. Interaction of the ejected and entrained gas dampens gas shear thereby reducing noise levels dramatically resulting in a high velocity, high volume sheet of gas achieved with minimum noise and gas consumption. One such knife is the EXAIR knife manufactured by EXAIR Corporation, 1250 Century Circle North, Cincinnati, Ohio 45246-3309.

Knife 22 has a plurality of mounting holes 30 on its top surface for attaching to a mounting plate 32 that has mounting holes 34 to align with mounting holes 30 in the knife. Mounting plate 32 is mounted atop an angled bracket 36 that is connected to a second angled bracket 38. Brackets 36, 38 form a J-shaped bracket with knife 22 mounted inside the J and mounting plate 32 mounted outside J. Bracket 36 has a slot into which knife 22 fits, and mounting plate 32 has a slot through which gas from knife 22 flows. The top end of the J is attached to an L-shaped bracket 40 that is connected to a backing plate 42 fastened to the housing 13. The mounting brackets 36, 38, 40 and the mounting plate 32 divide the interior of the housing into first and second compartments. Flux nozzle 18 is mounted in the first compartment while knife 22 is mounted in the second compartment. The main stream of gas from the knife flows from the first compartment through the slots in mounting plate 32 and bracket 36 to the first compartment where the gas stream directs flux upward through the opening 16 to the circuit board 12.

A residue collector 44 is mounted on the mounting plate 32 over the slot therein and has upstanding side and end panels that form a barrier to prevent flux residue from accumulating on the knife. The residue collector 44 forms an inverted well around the gas stream as the gas exits the knife forming an effective barrier from flux or other residue that may accumulate on the mounting brackets. The residue collector 44 also functions as a vertical gas guide to help shape the sheet of gas exiting the knife to the dimensions of the circuit board. It is important that the gas stream be clearly defined so that the flux that it entrains can be controllably deposited on the circuit board.

Because the flux is heavier than the inert gas in the housing, the flux falls out of the gas and may come to rest on components in the housing including the nozzle and knife. When flux accumulates on the nozzle or knife, it can distort the stream of gas resulting in over spray, under spray or generally poor application of flux with a waste of gas. Periodic cleaning is required which takes the device out of productive service thereby increasing fluxing time and increasing manufacturing costs. The present invention interposes a labyrinth 46 in the entrained gas stream so that gas leaving the first compartment where the flux is generated is filtered by the labyrinth on its way to the second compartment where the knife is located. The labyrinth thus functions as a filter to remove flux from the gas stream so that the flux is not available to foul the knife or nozzle.

The labyrinth 46 is composed of first and second opposed end panels 48, 50 and opposed top and bottom panels 52, 54 that are connected to the first and second panels 48, 50 forming a boxy structure with open front and rear faces. A front grill has plurality of louvers 56 extending between the first and second end panels and extending parallel to the top and bottom panels. The louvers 56 define horizontally extending openings or slots through which the entrained gas laden with flux enters. Similarly, a rear grill has plurality of louvers 58 extending between the first and second end panel and extending parallel to the top and bottom panels. The louvers 58 define horizontally extending slots through which the entrained gas substantially free of flux exits the labyrinth.

A center baffle 60 is positioned between the front and rear grills. When the entrained gas stream that flows through the front grill encounters the baffle 60, the stream is diverted by the baffle which causes the flux to gravitate toward the bottom of the labyrinth while the gas flows through the rear grill. The baffle changes the direction of flow of the gas stream so that the heavier flux particles are trapped while the gas passes through. Preferably, the center baffle is formed of a plurality of panels or louvers extending between the first and second end panels and extending parallel to the top and bottom panels but oriented at 90° to the front and rear grill louvers. The louvers of the center baffle define longitudinal, horizontal spaces between the louvers through which the gas flows. The center baffle louvers and the spaces are positioned such that gas entering through the front grill louvers strikes center baffle instead of merely flowing through the baffle openings. Preferably, there is a series of center baffles arranged so that it is impossible for any flux make the series of turns between the louvers and baffles without impinging the baffles and gravitating to the bottom of the labyrinth while the lighter gas flows through.

A corner baffle 62 is attached to the mounting plate 32 and positioned to help guide the entrained gas by the knife and through the slots in the mounting plate. The corner baffle effectively reduces the space in the housing and therefore the volume of gas which helps maintain the velocity of the gas stream. The corner baffle eliminates gas turbulence.

The new inert gas air horn distribution device utilizes a coanda effect when dispersing nitrogen to the circuit board. The system uses a small amount of compressed nitrogen but creates an increased velocity of nitrogen directed to the circuit board. The increased flow of surrounding nitrogen and the small amount of nitrogen contribute to a high gas motion for flux distribution and control. It utilizes an enclosure with a labyrinth that traps flux residue and eliminates build up of flux on the air knife surface. It also collects excess flux residue that accumulates on both sides of the nitrogen gas stream. Tests performed reveal that over spray and under spray are minimized to the extent that preventive maintenance is reduced by ninety per cent. Flux coverage on the circuit board is improved with a reduction of flux usage while retaining high quality output. Cryogenic nitrogen consumption is reduced dramatically and air knife clogging is eliminated. Also, circuit board repair and inspection man hours are reduced dramatically.

It will be now appreciated that an inert gas air horn distribution device has been presented that employs a labyrinth with a baffle to clean the nitrogen gas used to deposit flux on circuit boards before wave soldering operations. The baffle diverts the gas flow causing heavier flux particles to collect in the bottom of the labyrinth while the lighter gas exits for use in depositing flux on the circuit boards. The labyrinth cleans the gas thereby keeping the knife clean which produces more uniform results with less maintenance.

Operation of the present invention is believed to be apparent from the foregoing description and drawings, but a few words will be added for emphasis. As the gas travels in a coanda profile along the face of the knife, its high velocity pulls in surrounding gas causing contaminated gas to flow through the labyrinth where contaminants are removed. The cleaned gas joins the main stream from the knife and is directed upward through slots toward the housing opening. The stream is formed as a thin sheet that pulls in flux emitted by the flux nozzle and directs the flux toward the waiting circuit board where the flux is deposited.

While the invention has been described with reference to the preferred embodiment, it will be understood by those skilled in the art that various changes may be made and equivalents may be substituted for elements of the preferred embodiment without departing from invention. For example, the bottom panel of the labyrinth may have an opening or the bottom of the labyrinth may be open so that captured flux falls to the bottom of the housing for removal. In addition, many modifications may be made to adapt a particular situation and material to a teaching of the invention without departing from the essential teachings of the present invention. For example, the louvers or panels of the center baffle need not be perpendicular to the grill louvers. Angles other than 90° can be used as long as the louver intercepts the gas flow to block the flux. It is accordingly intended that the claims shall cover all such modifications and applications as do not depart from the true spirit and scope of the invention.

What is claimed is:

1. An inert gas air horn distribution device, comprising:
   a housing having a cover with an opening;
   a flux nozzle mounted in said housing for emitting flux toward said opening in said housing cover;
   a knife assembly having an inlet for receiving compressed gas, a face with a coanda profile, and an outlet for directing said compressed gas in a main stream over said face adhering to said coanda profile and upward toward said housing cover opening at a velocity sufficient for entraining surrounding gas in said housing causing said surrounding gas to flow in an entrained stream; and a labyrinth mounted in said housing in said entrained stream to capture flux in said stream and prevent said flux from fouling said knife.

2. A device, as set forth in claim 1, wherein said labyrinth is mounted at a lower elevation than said flux nozzle.

3. A device, as set forth in claim 1, wherein said labyrinth includes:

first and second opposed end panels, and top and bottom panels connected to said first and second panel forming a boxy structure with open front and rear faces;

a front grill mounted on said front face of said boxy structure, said front grill having a plurality of louvers extending between said first and second end panels parallel to said top and bottom panels and defining a plurality of slots extending parallel to said top and bottom panels;

a rear grill mounted on said rear face of said boxy structure, said rear grill having a plurality of louvers extending between said first and second end panels parallel to said top and bottom panels and defining a plurality of slots extending parallel to said top and bottom panels; and a center baffle positioned between said front and rear grills, said entrained stream flowing through said front grill and being diverted by said baffle blocking flux in said entrained stream while passing gas to said rear grill.

4. A device, as set forth in claim 1, wherein said labyrinth includes:

first and second opposed end panels, and top and bottom panels connected to said first and second panel forming a boxy structure with open front and rear faces;

a front grill having a plurality of louvers extending between said first and second end panels parallel to said top and bottom panels;

a rear grill having a plurality of louvers extending between said first and second end panels parallel to said top and bottom panels; and a center baffle positioned between said front and rear grills, said entrained stream flowing through said front grill and being diverted by said baffle blocking flux while passing gas to said rear grill.

5. A device, as set forth in claim 4, wherein said blocked flux collects on said bottom panel.

6. A device, as set forth in claim 4, including a mounting bracket attached to said housing and said top panel dividing said housing into first and second compartments, said flux nozzle being mounted in said first compartment and said knife being mounted in said second compartment.

7. A device, as set forth in claim 6, including a residue collector mounted on said mounting bracket in said first compartment, said residue collector having upstanding opposed side panels and end panels forming an boxy structure open adjacent said mounting bracket so that said main stream flows through said residue collector enroute to said opening in said housing cover, said upstanding panels forming a barrier preventing flux accumulating on said bracket in said first compartment from entering said main stream.

8. A device, as set forth in claim 6, wherein said knife is mounted on said mounting bracket in said second compartment.

9. A device, as set forth in claim 6, wherein said entrained stream collects flux in said first compartment before entering said labyrinth and deposits said flux in said labyrinth before entering said second compartment.

10. A device, as set forth in claim 9, including a corner baffle in said second compartment to direct said entrained stream toward said knife.

* * * * *